United States Patent [19]

Casa et al.

[11] Patent Number: 4,972,298

[45] Date of Patent: Nov. 20, 1990

[54] HIGH DENSITY CIRCUIT ASSEMBLY

[75] Inventors: Gene E. Casa, Ruby; Joseph W. Gernon, Kingston, both of N.Y.

[73] Assignee: International Business Machines Corporation, Armonk, N.Y.

[21] Appl. No.: 404,807

[22] Filed: Sep. 8, 1989

[51] Int. Cl.$^5$ ............................................. H02B 1/01
[52] U.S. Cl. ................................... 361/429; 361/391; 361/393; 361/428
[58] Field of Search .................. 211/41; 361/390, 391, 361/393, 395, 398–399, 413, 415, 428–429

[56] References Cited

U.S. PATENT DOCUMENTS

| | | | |
|---|---|---|---|
| 2,880,379 | 3/1959 | Stoddart et al. | 317/101 |
| 3,001,102 | 9/1961 | Stiefel et al. | 317/99 |
| 3,476,983 | 11/1969 | DeRobertis | 317/101 |
| 3,669,279 | 6/1972 | Burgard et al. | 211/41 |
| 3,727,168 | 4/1973 | Henschen et al. | 339/17 |
| 3,728,662 | 4/1973 | Puri | 361/391 |
| 3,755,630 | 8/1973 | Boyer | 179/98 |
| 3,812,402 | 5/1974 | Garth | 317/100 |
| 3,954,182 | 5/1976 | McEvers | 211/94 |
| 3,993,936 | 11/1976 | Meade et al. | 317/101 |
| 4,002,892 | 1/1977 | Zielinski | 235/156 |
| 4,039,902 | 8/1977 | Lacan et al. | 361/395 |
| 4,145,620 | 3/1979 | Dice | 307/149 |
| 4,179,172 | 12/1979 | Godsey et al. | 339/17 |
| 4,197,434 | 4/1980 | Inamasu et al. | 179/98 |
| 4,321,654 | 6/1982 | Nakajo et al. | 361/396 |
| 4,337,499 | 6/1982 | Cronin et al. | 361/386 |
| 4,470,100 | 9/1984 | Rebaudo et al. | 361/413 |
| 4,498,123 | 2/1985 | Fuss et al. | 361/427 |
| 4,509,810 | 4/1985 | Erlam et al. | 339/17 |
| 4,574,332 | 3/1986 | Calabro | 361/413 |
| 4,675,538 | 6/1987 | Epstein | 307/64 |
| 4,683,424 | 7/1987 | Cutright et al. | 361/415 |
| 4,695,920 | 9/1987 | Klebba et al. | 361/415 |
| 4,716,495 | 12/1987 | Craker | 361/391 |
| 4,730,232 | 3/1988 | Lindberg | 361/390 |
| 4,748,540 | 5/1988 | Henneberg et al. | 361/424 |
| 4,811,165 | 3/1989 | Currier et al. | 361/413 |

OTHER PUBLICATIONS

IBM Technical Disclosure Bulletin, vol. 20, No. 7, 12/77, pp. 2524—Battiloro et al., "Modular Cable Distribution for Rack-Mounted Equipment".
IBM Technical Disclosure Bulletin, vol. 15, No. 11, 4/73, pp. 3408-3409, Atkinson et al., "Pluggable Storage Modules".
IBM Technical Disclosure Bulletin, vol. 13, No. 7, 12/70, pp. 2076 and 2077—Damari, "Electronic Page Assembly".

*Primary Examiner*—Gregory D. Thompson
*Attorney, Agent, or Firm*—Robert L. Troike

[57] ABSTRACT

A high density circuit computer assembly is provided by placing TCMs on a support board together with a printed circuit (PC) interconnect board, power supplies for TCMs to form a book package which, in turn, is slidably mounted on edge of the support board to a bookcase-like frame between shelves of the bookcase. The panel of connectors for the TCMs are placed on the support board at one end of the package to present a front connecting surface along the front face of the bookcase-like frame. A flexible multi-conductor board is coupled between the panel of connectors and the PC board. Multi-conductor cables extend along the front face and interconnect the connectors from one book package to another book package.

10 Claims, 4 Drawing Sheets

HIGH DENSITY CIRCUIT ASSEMBLY

This invention relates to a circuit assembly which provides an increased high circuit packing density.

BACKGROUND OF THE INVENTION

IBM Corporation's TCMs (temperature controlled modules) provide a very high circuit packing density. These TCMs can hold for example over 150 integrated circuit chips and the number of chips is increasing. The TCMs are then placed on a mother circuit board sometimes referred to as "Clark" board that provides a relatively high circuit density. When these Clark boards are placed in a standard frame which is 749.3 millimeters wide, 1705 millimeters high and about 1524 millimeters long along with the power supply, it is only possible to place two such Clark boards in a frame with a board TCM density of only six 127 millimeter TCMs. This only packages 12 TCMs to a frame. The power supplies are separately located in the frame and heavy bus lines are used to connect the TCMs to the power supplies.

SUMMARY OF THE INVENTION

In accordance with one embodiment of the present invention a high density interconnection circuit assembly is provided wherein a frame comprises bookshelves and each bookshelf contains book packages slidably mounted in the shelves in the manner of books. Each book package includes high density circuit modules, a printed circuit board coupled to the modules, its own power supply, a high density connector panel extending generally across one end of the board and along one face of the frame and a coupling connector coupling the said printed circuit board to said front connector panel.

DESCRIPTION OF PREFERRED EMBODIMENT

Figure 1:
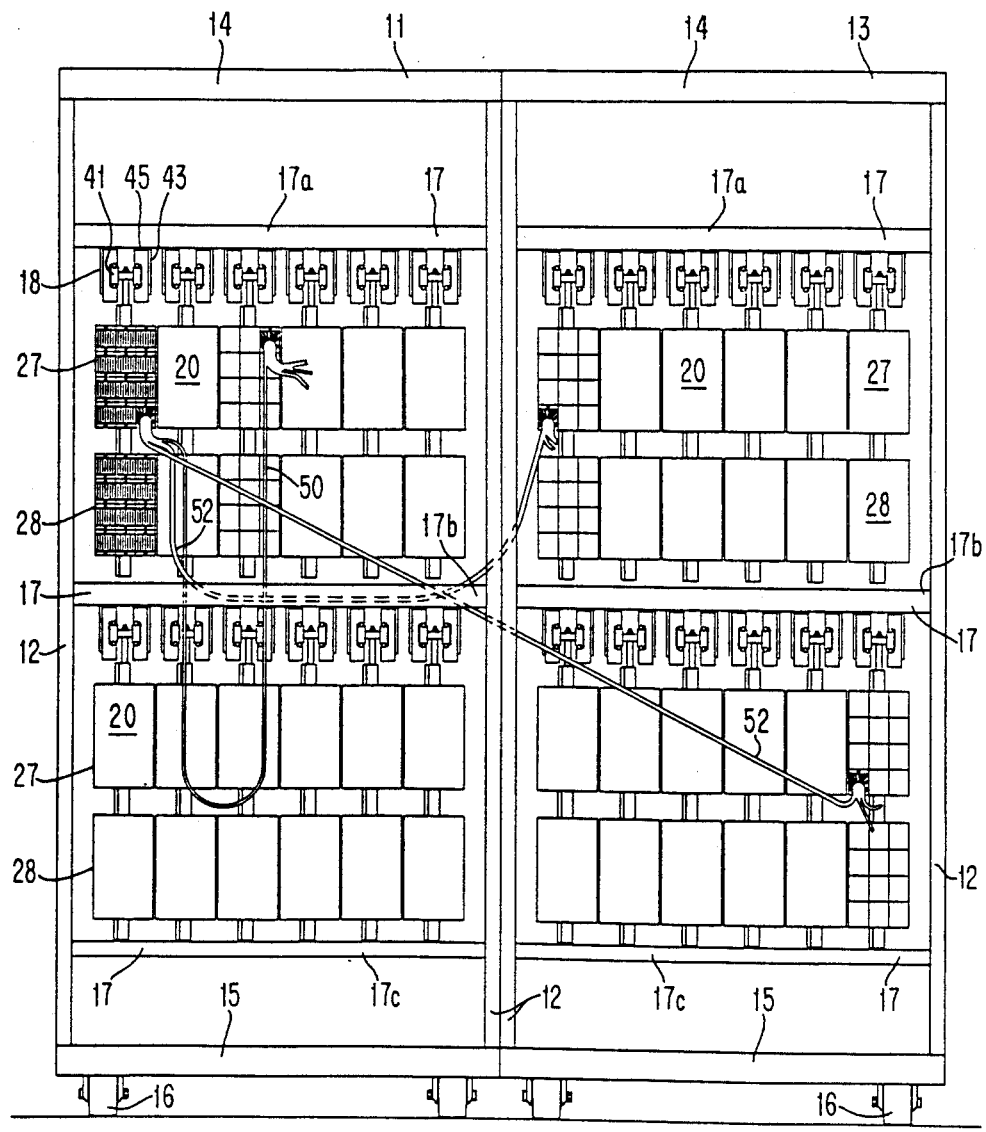
FIG. 1 is an elevation view of a pair of frames joined according to one embodiment of the present invention.

Referring to FIG. 1 there is illustrated a pair of frames 11 and 13 joined side by side. The frames 11 and 13 each include vertical support members 12 spaced by top members 14 and base members 15 and by shelf members 17. Casters 16 may be mounted to the base member 15 to permit the frames to be easily moved. There are for example three shelf members 17 spaced between the vertical members 12 for each of the frames 11 and 13. Book packages 20 including a stiffener board with a printed circuit interconnect board and TCMs are placed vertically on edge between the shelf members 17 as illustrated in FIG. 1. For the embodiment disclosed there are six book packages 20 located between shelf member 17a and middle shelf member 17b and another six book packages 20 positioned between shelf members 17b and 17c. These book packages are slidably mounted to the shelf members by slide mechanisms 18 attached between shelf members 17a and 17b and the upper edges of the packages 20 to permit the packages to be slid in and out of the frame in the manner of books in a book case. Each of these book packages 20 may contain four TCMs so that each frame could provide 48 TCMs. The shelf member may be a grid structure with cross members between the vertical members 12 and members between the cross members that attach to the slide mechanism 18 and extend along the depth of the frame or in and out of the frame as pictured in FIG. 1.

Figure 2:
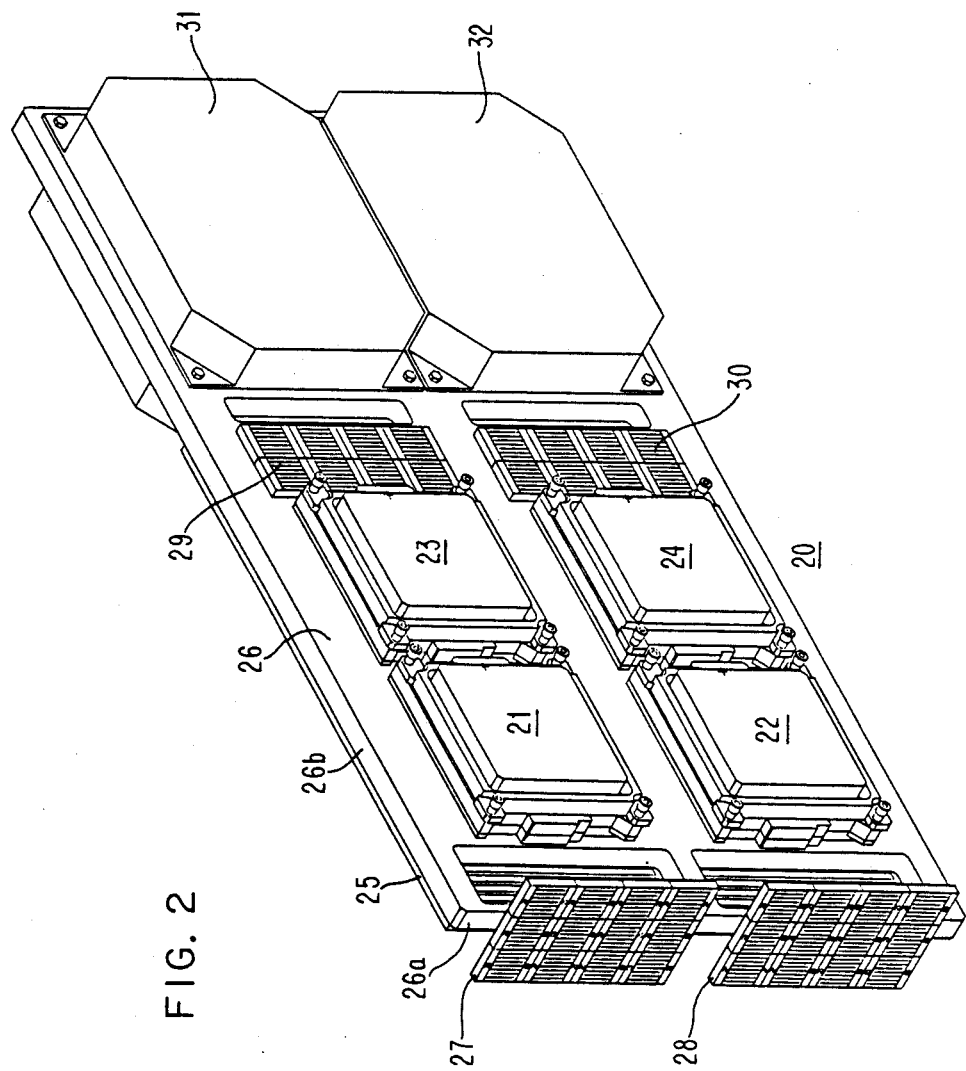
FIG. 2 is a perspective view of a book package as used in FIG. 1.

Referring to FIG. 2 there is illustrated in a perspective view a book package 20 and its components which include a stiffener or support board 26 and four TCMs 21–24, a printed circuit (PC) interconnect board 25, two front connector panels 27 and 28 (each capable of handling 1728 connections), flex circuits 35 (shown in FIG. 3) between the connector panels 27 and 28 and the printed circuit board 25, rear connector modules 29 and 30 (providing two groups of 1152 signal I/0 connectors near the rear) and power supplies 31 and 32 for powering the four TCMs mounted to the stiffener board 26.

Figure 3:
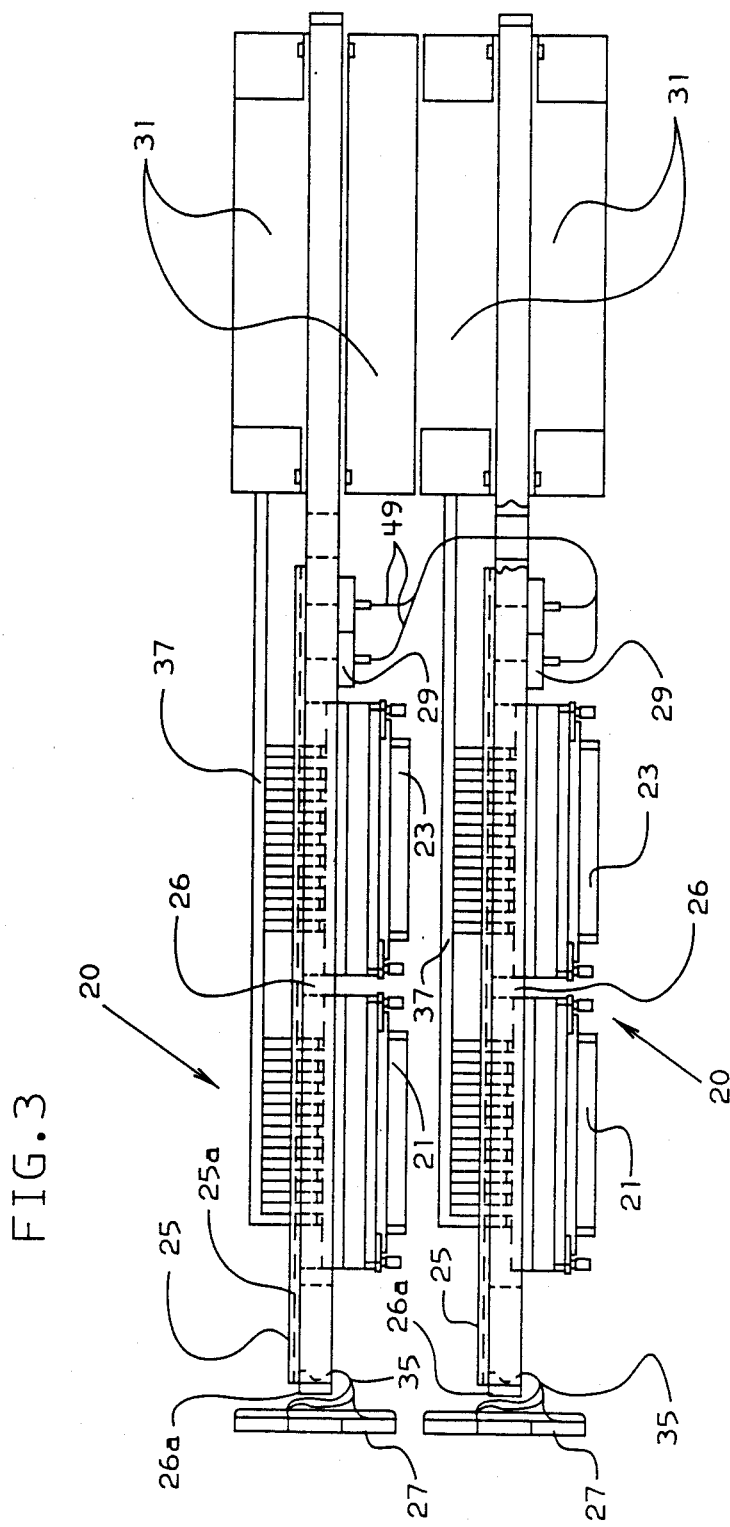
FIG. 3 is a top view of a book package of FIG. 2.

Referring to the top view in FIG. 3 there is illustrated a pair of book packages 20 side by side. The board 26 has the printed circuit board 25 and the TCMs 21 and 23 attached (TCMs 22 and 24 attached below are blocked from view). The connector panels 27 and 28 are fixed at one end 26a to board 26 and extend orthogonal to the boards 25 and 26. Extending along the length of the printed circuit board 25 are printed circuit conductors illustrated by dashed lines 25a that couple between the rear connector modules 29 and 30 and the TCM modules 21–24, and between the TCM modules 21–24 and the flex circuits 35 at the end front of the interconnect board 25. The TCM modules 21–24 and the rear connector modules 29 and 30 are mounted to the stiffener or support board 26 and extend through apertures in the board 26 to mate and connect with the conductors of the PC board 25. The modules are fixed via a peripheral flanges (not shown) that does not pass through the aperture. The end 26a of the board 26 and the plane of the panel 27 extend along the front face of the frame for connection to other book packages 20. The flexible circuit 35 is made of flexible printed circuit conductors on a flexible film to provide the necessary flexible interconnection between the printed circuit board 25 and the connectors on the orthogonal connector panel 27. Power for the TCMs is provided via power buses 37 located on the opposite or backside of the TCMs 21–24. Cooling for the TCMs and power supplies is provided via piping not shown. FIG. 3 also shows how closely placed book packages 20 can be connected via cables 49 between the rear connectors 29.

Referring to FIG. 1 there is illustrated how when the book packages are placed in the frame they are interconnected with cables 152 50 using the front set of connectors or connector panels. It can be seen that the connectors at the extreme corners of the frames can be connected with a cable of relatively short length. For the standard size of frames indicated 48 TCMs are within a 1250 millimeter interconnect length. This is extremely important when dealing with rapid high speed computer systems in order to prevent delays and increase the over all speed of the system.

Figure 4:
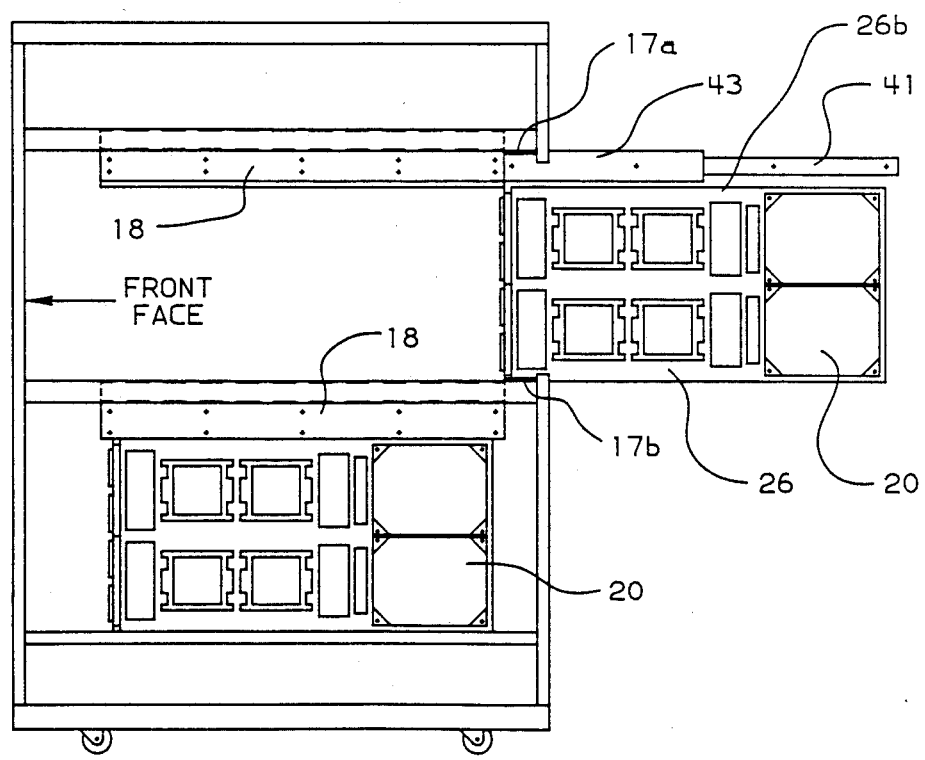
FIG. 4 illustrates how the book packages can be pulled out to the rear on slides.

Referring to FIG. 4 there is demonstrated how the book packages 20 are pulled out from the rear on the slides 18. This can be accomplished once the cables are unplugged from the front of the book package. The cables are unplugged from the book packages from the front end in large groups to allow the packages to be slid backwards. The top edge 26b of the support board 26 of book package 20 may be mounted to a slide bar 41 which slides along U-shaped channels 43. Bearings 45 such as encapsulated ball bearings can be interfaced between the slide bar 41 and the channels 43. The bottom edge could fit in a U-shaped channel (not shown).

In accordance with this invention the cables 50, 52 could be mounted on a cable organizer unit as disclosed in our copending patent application No. 07/405,614, filed Sept. 8, 1989 concurrently herewith, for interconnecting a plurality of such connections in one operation. This copending application involves same inventors as the present application and is entitled "Cable Organizer". The cable length can be adjusted with loops, etc. in order to provide equalized cable lengths in cases of skew requirements or in other words in places where there are problems of unequal delays between critical elements.

We claim:

1. A high density interconnection computer circuit assembly comprising:
    a bookcase-shaped frame having vertical support members and lateral support shelf members between said vertical members;
    a plurality of generally rectangular book packages, each book package slidably mounted along one edge to at least one shelf member with the book packages having a broad surface extending between the shelf members, each package including support board means having printed circuit interconnect conductors and including mounted to said board means a plurality of high density circuit modules coupled to said interconnect conductors, power supply, a panel of connectors, and a multi-conductor coupler coupled between said printed circuit interconnect conductors and said panel of connectors, said interconnect conductors and said multi-conductor coupler interconnecting said high density circuit modules to connectors on said panel of connectors, each said package further including power bus lines between said high density circuit modules and said power supply for providing self contained power to said modules on said packages;
    each of said panel of connectors mounted across that one end of each of said support board means that faces a given broad face of the frame when each said package is in its operating position between the shelf members; and
    conductor means coupled between at least one pair of said panel of connectors for interconnecting said packages via said pair of said panel of connectors with said conductor means extending along the given face of the frame.

2. The combination of claim 1 wherein said high density circuit modules are TCMs.

3. The combination of claim 1 wherein each of said panel of connectors are fixed generally orthogonal to said support board means.

4. The combination of claim 3 wherein each of said multi-conductor couplers are flexible to bend at right angles.

5. The combination of claim 1 wherein said conductor means includes multi-wire cables coupled between said pair of said panel of connectors.

6. A high density interconnection computer circuit assembly comprising:
    a plurality of bookcase-like frames with shelf members joined side by side;
    a plurality of generally rectangular book packages each book package slidably mounted along one edge to at least one shelf member with the book packages having a broad surface extending in a vertrical direction between the shelf members, said packages including a support board having mounted thereto on an interconnect PC board, a plurality of high density circuit modules, power supplies for said modules, a panel of connectors, and a multi-conductor flex circuit with the flex circuit conductors coupled between said PC board and said panel of connectors, said PC board interconnecting said high density circuit modules to said connectors on said panel, said packages further including power bus lines between said high density circuit modules and said power supplies for providing self contained power to said modules;
    each of said panel of connectors mounted across that one end of each of said support board means that faces a given board face of the frames when each said package is in its operating position; and
    conductor means coupled between pairs of said panel of connectors for interconnecting said packages within said frames via said connectors with said conductor means extending along the given face of the frames.

7. The combination of claim 6 wherein said high density circuit modules are TCMs.

8. The combination of claim 7 wherein there are four TCMs on each support board means.

9. The combination of claim 6 wherein connector is generally orthogonal to each of said panel of connectors are said support board means.

10. The combination of claim 6 wherein said conductor means includes multi-wire cables coupled between each of said panel of connectors.

* * * * *